United States Patent
Tsai

(10) Patent No.: US 9,948,318 B1
(45) Date of Patent: Apr. 17, 2018

(54) DELTA-SIGMA MODULATOR AND METHOD FOR ENHANCING STABILITY OF DELTA-SIGMA MODULATOR

(71) Applicant: MEDIATEK INC., Hsin-Chu (TW)

(72) Inventor: Hung-Chieh Tsai, Kaohsiung (TW)

(73) Assignee: MEDIATEK INC., Hsin-Chu (TW)

( * ) Notice: Subject to any disclaimer, the term of this patent is extended or adjusted under 35 U.S.C. 154(b) by 0 days.

(21) Appl. No.: 15/784,198

(22) Filed: Oct. 16, 2017

Related U.S. Application Data

(60) Provisional application No. 62/423,223, filed on Nov. 17, 2016.

(51) Int. Cl.
    *H03M 3/00* (2006.01)

(52) U.S. Cl.
    CPC ........... *H03M 3/424* (2013.01); *H03M 3/322* (2013.01); *H03M 3/458* (2013.01)

(58) Field of Classification Search
    CPC ...... H03M 3/424; H03M 3/458; H03M 3/322; H03M 3/00; H03M 3/30; H03M 3/50; H03M 7/3004; H03M 1/12
    USPC .................................................. 341/155, 143
    See application file for complete search history.

(56) References Cited

U.S. PATENT DOCUMENTS

| | | | | |
|---|---|---|---|---|
| 7,696,913 B2* | 4/2010 | Melanson | ........... | H02M 1/4225 341/143 |
| 8,618,967 B2* | 12/2013 | Nikaeen | ................ | H03M 3/458 327/141 |
| 8,736,474 B1* | 5/2014 | Wang | ..................... | H03M 3/454 341/143 |
| 2014/0232579 A1* | 8/2014 | Kabir | .................... | H03M 1/002 341/143 |

OTHER PUBLICATIONS

Bolatkale, "A 4 GHz Continuous-Time delta-sigma ADC With 70 dB DR and 74 dBFS THD in 125 MHz BW", IEEE Journal of Solid-State Circuits, vol. 46, No. 12, Dec. 2011.
Lo, "A 75.1dB SNDR 840MS/s CT delta-sigma Modulator with 30MHz Bandwidth and 46.4fJ/conv FOM in 55nm CMOS", 2013 Symposium on VLSI Circuits Digest of Technical Papers.
Dong, "A 235mW CT 0-3 MASH ADC Achieving—167dBFS/Hz NSD with 53MHz BW", 2014 IEEE International Solid-State Circuits Conference.
Matsukawa, "A 10 MHz BW 50 fJ/conv. Continuous Time delta-sigma Modulator with High-order Single Opamp Integrator using Optimization-based Design Method", 2012 Symposium on VLSI Circuits Digest of Technical Papers.

* cited by examiner

*Primary Examiner* — Jean B Jeanglaude
(74) *Attorney, Agent, or Firm* — Winston Hsu

(57) ABSTRACT

A delta-sigma modulator includes a receiving circuit, a loop filter, a quantizer with a negative capacitor circuit and a feedback circuit. The receiving circuit is arranged for receiving an input signal and a feedback signal to generate a first signal. The loop filter is coupled to the receiving circuit, and is arranged for receiving the first signal to generate a filtered signal. The quantizer is coupled to the loop filter, and is arranged for generating a digital output signal according to the filtered signal, wherein the negative capacitor circuit is arranged at an input terminal of the quantizer. The feedback circuit is arranged for receiving the digital output signal to generate the feedback signal.

18 Claims, 5 Drawing Sheets

DELTA-SIGMA MODULATOR AND METHOD FOR ENHANCING STABILITY OF DELTA-SIGMA MODULATOR

CROSS REFERENCE TO RELATED APPLICATIONS

This application claims the priority of U.S. Provisional Application No. 62/423,223, filed on Nov. 17, 2016, which is included herein by reference in its entirety.

BACKGROUND

For a clock frequency larger than a value e.g., 1 GHz, in a continuous-time delta-sigma modulator, the stability issue due to parasitic capacitance from a quantizer or excess loop delay (ELD) compensation path becomes troublesome. In addition, in the high bandwidth application, an oversampling ratio (OSR) is generally not enough and non-ideal effect may occur to lower the stability, therefore, a high bit-number quantizer (e.g. 5-bit quantizer) is used to improve the performance and stability. However, using the high bit-number quantizer may induce a heavy input load (e.g. parasitic capacitance), and an extra pole may be generated due to the input load, which influences the stability of the circuit and increases design efforts.

SUMMARY

It is therefore an objective of the present invention to provide a delta-sigma modulator, which can improve the stability issue by eliminating the parasitic capacitance in the "$s^{-1}$" path in the loop filter and the ELD path, to solve the above-mentioned problem.

According to one embodiment of the present invention, a delta-sigma modulator comprises a receiving circuit, a loop filter, a quantizer with a negative capacitor circuit and a feedback circuit. The receiving circuit is arranged for receiving an input signal and a feedback signal to generate a first signal. The loop filter is coupled to the receiving circuit, and is arranged for receiving the first signal to generate a filtered signal. The quantizer is coupled to the loop filter, and is arranged for generating a digital output signal according to the filtered signal, wherein the negative capacitor circuit is arranged at an input terminal of the quantizer. The feedback circuit is arranged for receiving the digital output signal to generate the feedback signal.

According to another embodiment of the present invention, a method for enhancing stability of a delta-sigma modulator comprises: receiving an input signal and a feedback signal to generate a first signal; receiving the first signal to generate a filtered signal; providing a quantizer with a negative capacitor circuit, to generate a digital output signal according to the filtered signal, wherein the negative capacitor circuit is arranged at an input terminal of the quantizer; and receiving the digital output signal to generate the feedback signal.

These and other objectives of the present invention will no doubt become obvious to those of ordinary skill in the art after reading the following detailed description of the preferred embodiment that is illustrated in the various figures and drawings.

DETAILED DESCRIPTION

Certain terms are used throughout the following description and claims to refer to particular system components. As one skilled in the art will appreciate, manufacturers may refer to a component by different names. This document does not intend to distinguish between components that differ in name but not function. In the following discussion and in the claims, the terms "including" and "comprising" are used in an open-ended fashion, and thus should be interpreted to mean "including, but not limited to . . . " The terms "couple" and "couples" are intended to mean either an indirect or a direct electrical connection. Thus, if a first device couples to a second device, that connection may be through a direct electrical connection, or through an indirect electrical connection via other devices and connections.

Figure 1:
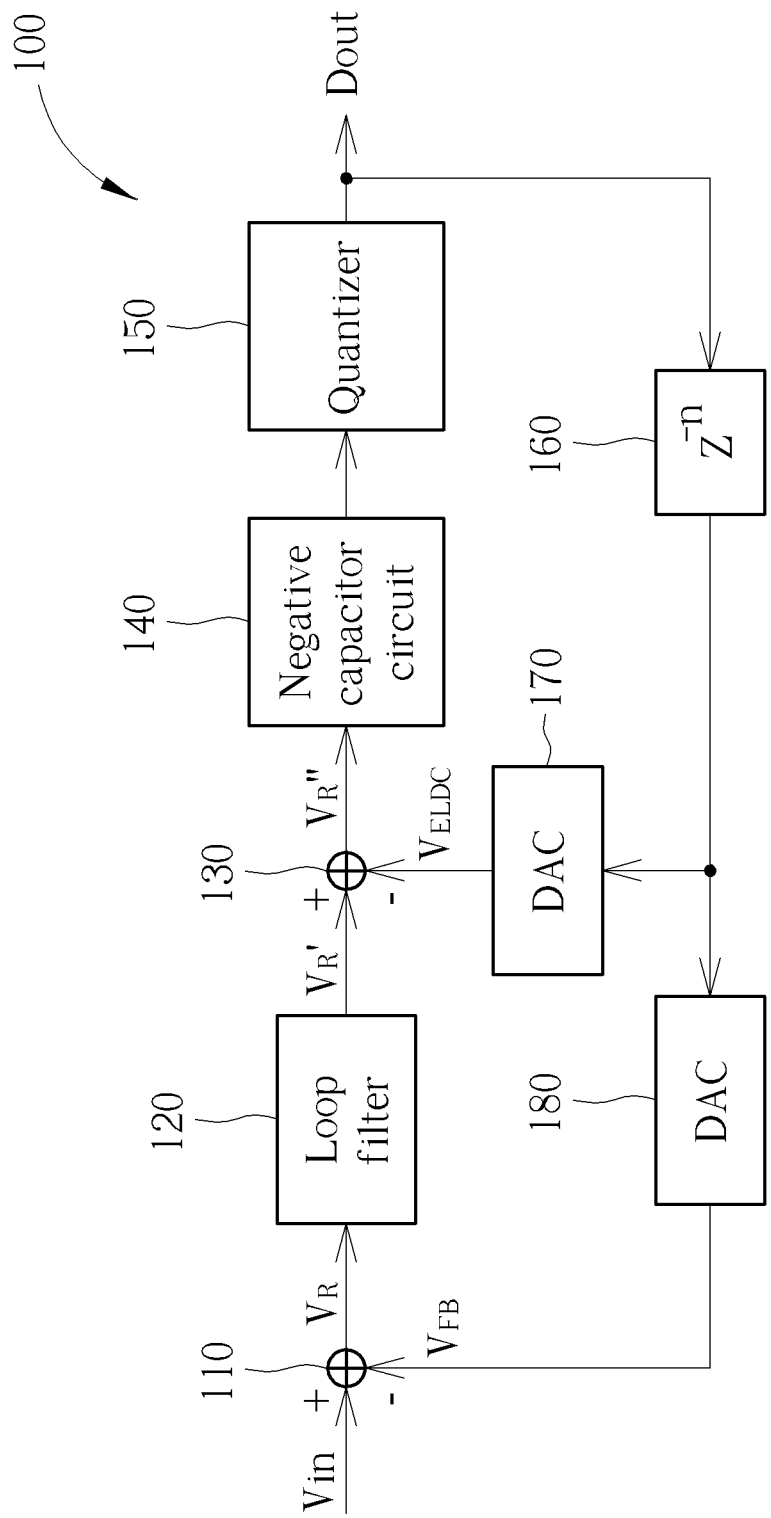
FIG. 1 is a diagram illustrating a continuous-time delta-sigma modulator according to one embodiment of the present invention.

Please refer to FIG. 1, which is a diagram illustrating a continuous-time delta-sigma modulator 100 (continuous-time delta-sigma modulator type analog to digital converter (ADC)) according to one embodiment of the present invention. As shown in FIG. 1, the delta-sigma modulator 100 comprises a receiving circuit 110, a loop filter 120, a subtractor 130, a negative capacitor circuit 140, a quantizer 150, a phase delay/adjusting circuit 160 and two digital-to-analog converters (DAC) 170 and 180. In this embodiment, the loop filter 120 comprises a plurality of amplifying stages connected in series, and each amplifying stage may be implemented by an integrator.

In the operations of the delta-sigma modulator 100, the receiving circuit 110 receives an input signal Vin and a feedback signal $V_{FB}$, and calculates a difference by subtracting the feedback signal $V_{FB}$ by the input signal Vin to generate a first signal $V_R$. In one embodiment of the present disclosure, the receiving circuit 110 can be implemented using an adder. Then, the loop filter 120 filters the first signal $V_R$ to generate a filtered signal $V_R'$. The subtractor 130 calculates a difference between the filtered signal $V_R'$ and an ELD compensation signal $V_{ELDC}$ to generate a compensated subtraction signal $V_R''$. In one embodiment of the present disclosure, the subtractor 130 can be implemented using an adder. The quantizer 150 generates a digital output signal Dout according to the compensated subtraction signal $V_R''$. Then, the digital output Dout is processed by the phase delay/adjusting circuit 160, and the DAC 180, serving as a first feedback circuit, performs a digital-to-analog converting operation upon the signal outputted from the phase delay/adjusting circuit 160 to generate the feedback signal $V_{FB}$ to the receiving circuit 110; and the DAC 170, serving as a second feedback circuit, performs the digital-to-analog converting operation upon the signal outputted from the phase delay/adjusting circuit 160 to generate the ELD compensation signal $V_{ELDC}$ to the subtractor 130.

The negative capacitor circuit 140 is arranged at an input terminal of the quantizer 150, wherein the negative capacitor circuit 140 is named because the negative capacitor circuit 140 provides equivalently an extra phase leading of the loop of the delta-sigma modulator 100. By using the negative capacitor circuit 140, the input parasitic capacitance of the quantizer 150 can be reduced, and the extra pole generated in the ELD compensation path can be improved.

Figure 2:
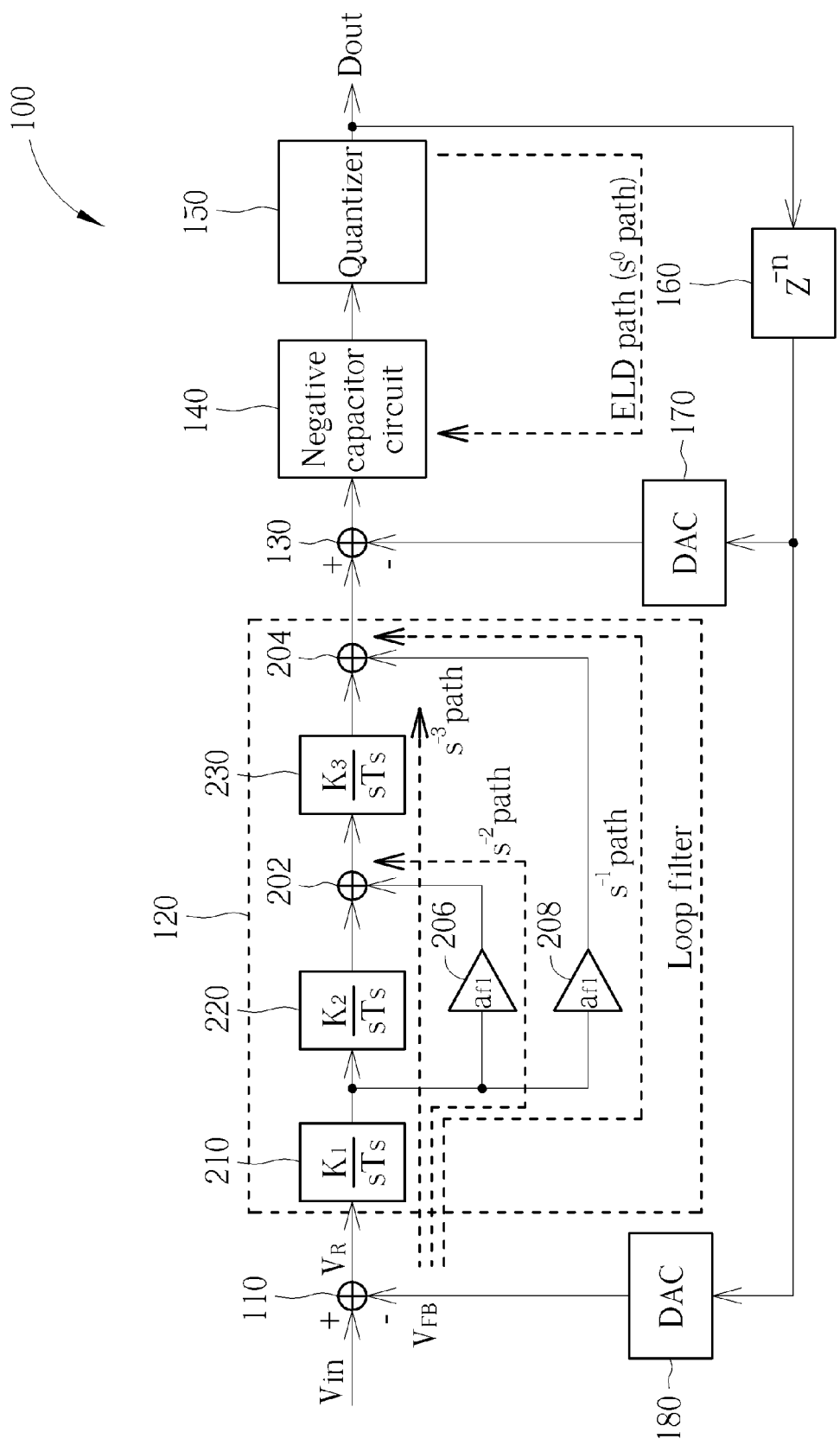
FIG. 2 shows the loop filter 120 according to one embodiment of the present invention.

FIG. 2 shows the loop filter 120 according to one embodiment of the present invention. As shown in FIG. 2, the loop filter 120 comprises three inverters 210, 220 and 230, two combiners 202 and 204, and two feed-forward paths 206 and 208, where the terms "$K_1/sTs$", "$K_2/sTs$" and "$K_3/sTs$" are used to represent the transfer functions of the inverters 210, 220 and 230, respectively, and the terms "$a_{f1}$" and "$a_{f2}$" are used to represent gains of the feed-forward paths 206 and 208. The combiner 202 is used to add the output of the integrator 220 and a signal generated by the feed-forward path 206, and the combiner 204 is used to add the output of the integrator 230 and a signal generated by the feed-forward path 208. In the delta-sigma modulator 100 shown in FIG. 2, there are three paths in the loop filter 120 and an ELD path formed by the phase delay/adjusting circuit 160 and the DAC 170, where the signal passes through the integrators 210, 220 and 230 can be regarded as a "$s^{-3}$" path, the feed-forward path 206 can be regarded as a "$s^{-2}$" path because of two integrators 210 and 230 are on the path, the feed-forward path 208 can be regarded as a "$s^{-1}$" path because only one integrator 210 is on the path, and the ELD path can be regarded as a "$s^0$" path because no integrator is on the path. The path with lower order(s) is/are critical to the stability of the delta-sigma modulator 100 because they are the major causes of the phase margin. Because the feed-forward path 208 (i.e. "$s^{-1}$" path) becomes tough especially in the low OSR application, in the conventional art, the integrator 210 requires more power to gain the high bandwidth to improve the delay of the "$s^{-1}$" path. In the embodiment shown in FIG. 2, however, the negative capacitor circuit 140 is provided to lower the input parasitic capacitance of the quantizer 150 (i.e. to lower the parasitic capacitance in the feed-forward path 208) to improve the stability of the delta-sigma modulator 100, and by using the negative capacitor circuit 140, the design efforts for solving the stability problem in the high bandwidth application can be relaxed, and the power consumption may be improved.

In addition, the subtractor 130 can be implemented using passive elements such as resistors and capacitors, without using any operational amplifier. This implementation of the subtractor 130 may generate an extra pole in the ELD path, which may influence the performance. Similarly, the negative capacitor circuit 140 can also improve this situation because the input parasitic capacitance of the quantizer (parasitic capacitance in the ELD path) is reduced.

It is noted that the structure of the loop filter 120 and the ELD path are for illustrative purposes only, and they are not limitations of the present invention. In other embodiments, the loop filter 120 may have more than three integrators, and the internal connections and/or feed-forward paths may have different designs. In addition, the ELD compensation signal $V_{ELDC}$ may be inputted into an internal node of the loop filter 120. As long as the negative capacitor circuit 140 is intentionally provided at the input terminal of the quantizer 150, the stability and performance of the delta-sigma modulator having these different loop filter and ELD path designs should be improved, and these alternative designs shall fall within the scope of the present invention.

Figure 3:
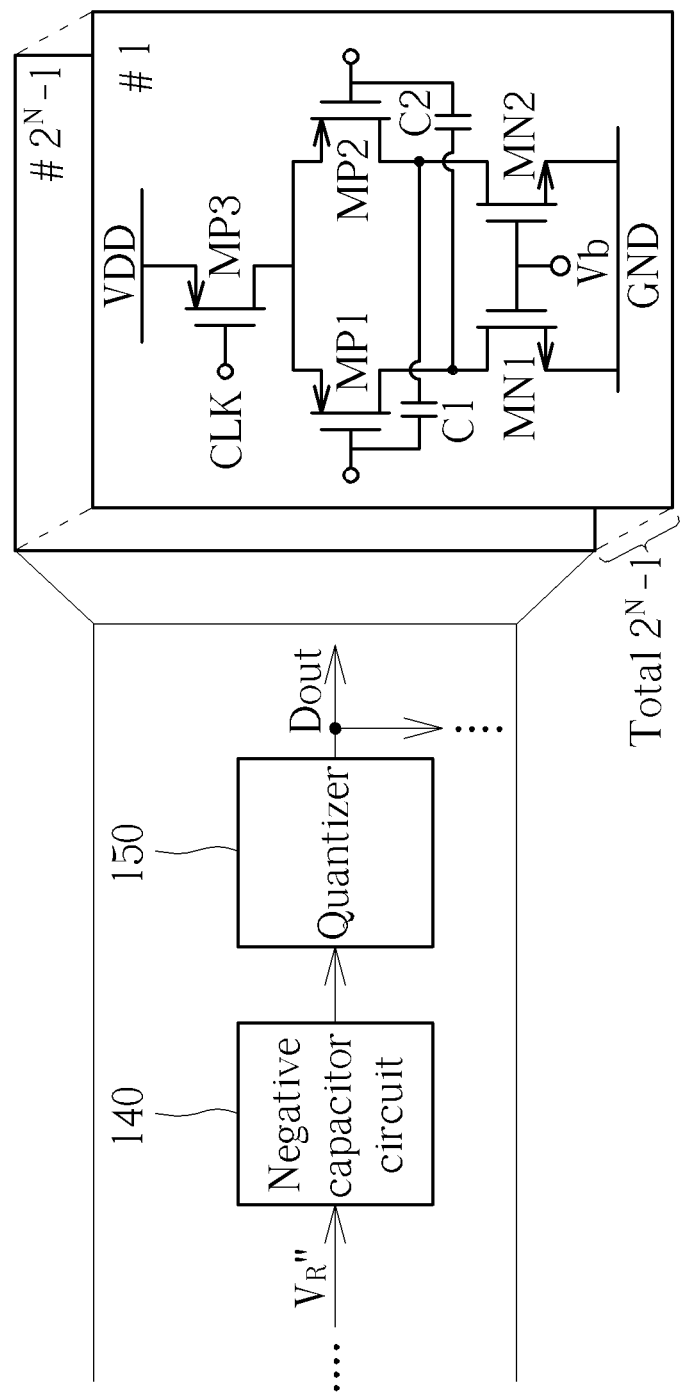
FIG. 3 shows the quantizer with the negative capacitor circuit according to one embodiment of the present invention.

In one embodiment, the negative capacitor circuit 140 is positioned inside the quantizer 150, and the negative capacitor circuit 140 is used to provide capacitance in the positive feedback paths of the comparators within the quantizer 150. FIG. 3 shows the quantizer 150 with the negative capacitor circuit 140 according to one embodiment of the present invention. As shown in FIG. 3, the quantizer 150 is an N-bit quantizer (i.e. the digital output signal Dout is $2^N-1$ bits thermometer code), and the quantizer 150 comprises ($2^N-1$) comparators. Each of the comparator comprises three P-type metal-oxide semiconductors (PMOSs) MP1, MP2 and MP3, and two N-type metal-oxide semiconductors (NMOSs) MN1 and MN2, where agate electrode of the PMOS MP1 serves as one input terminal for receiving one of the compensated subtraction signal $V_R''$ or a reference voltage, and a drain electrode of the PMOS MP1 serves as an output terminal; a gate electrode of the PMOS MP2 serves as another input terminal for receiving another one of the compensated subtraction signal $V_R''$ or the reference voltage, and a drain electrode of the PMOS MP2 serves as another output terminal; a source electrode of the PMOS MP3 is coupled to a supply voltage VDD, a drain electrode of the PMOS MP3 is coupled to source electrodes of the PMOSs MP1 and MP2, and a gate electrode of the PMOS MP3 is controlled by a clock signal CLK; a drain electrode of the NMOS MN1 is coupled to the drain electrode of the PMOS MP1, and a source electrode of the NMOS MN1 is coupled to a ground voltage; and a drain electrode of the NMOS MN2 is coupled to the drain electrode of the PMOS MP2, a source electrode of the NMOS MN2 is coupled to the ground voltage, and gate electrodes of the NMOSs MN1 and MN2 are controlled by a bias voltage. In addition, a capacitor C1 is positioned between the gate electrode (input terminal) of the PMOS MP1 and the drain electrode (output terminal) of the PMOS MP2 to provide a capacitance in this positive feedback path, and a capacitor C2 is positioned between the gate electrode (input terminal) of the PMOS MP2 and the drain electrode (output terminal) of the PMOS MP1 to provide a capacitance in this positive feedback path. By using the capacitors C1 and C2 serving as the negative capacitors, the input capacitance of the comparators (i.e. the parasitic capacitance between the gate electrodes of the PMOS MP1/MP2 and ground) within the quantizer 150 can be reduced, and the stability problem in the "$s^{-1}$" s path and the ELD path can be improved.

Figure 4:
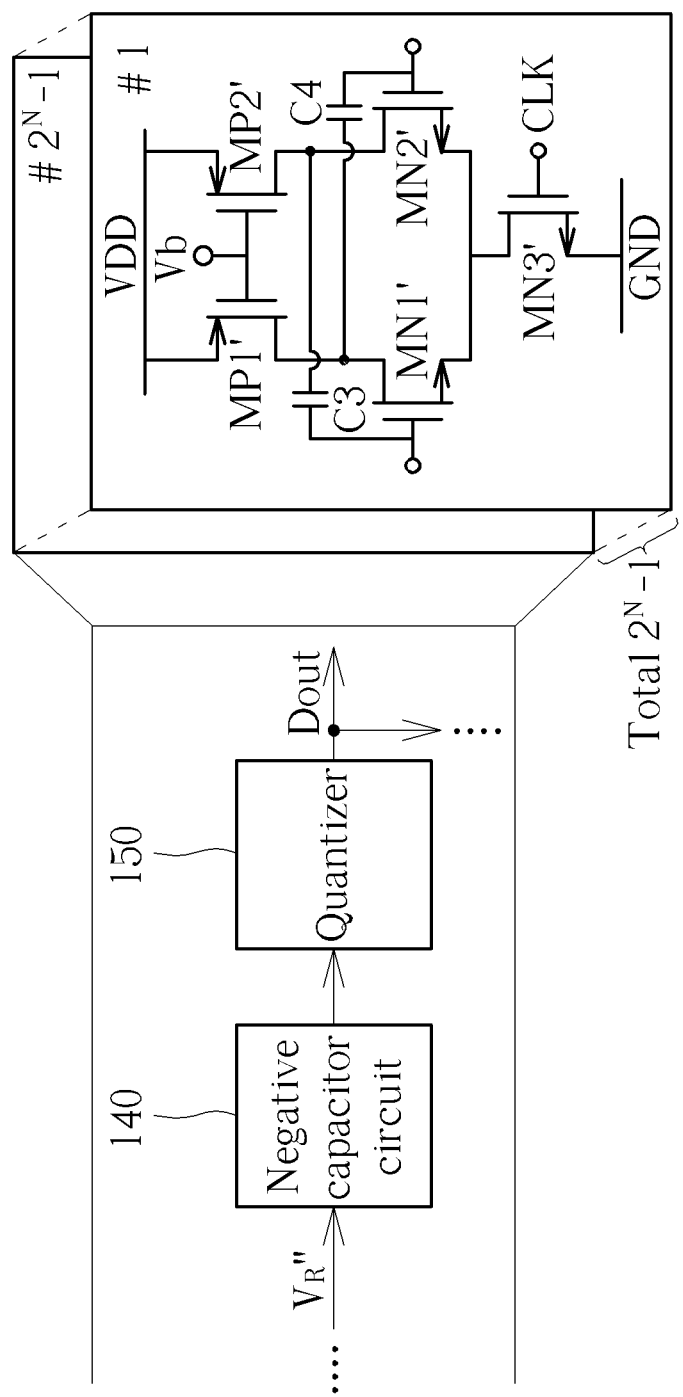
FIG. 4 shows the quantizer with the negative capacitor circuit according to another embodiment of the present invention.

FIG. 4 shows the quantizer 150 with the negative capacitor circuit 140 according to another embodiment of the present invention. As shown in FIG. 4, the quantizer 150 is an N-bit quantizer, and the quantizer 150 comprises ($2^N-1$) comparators. Each of the comparator comprises three NMOSs MN1, MN2 and MN3, and two PMOSs MP1 and MP2, where a gate electrode of the NMOS MN1 serves as one input terminal for receiving one of the compensated subtraction signal $V_R''$ or a reference voltage, and a drain electrode of the NMOS MN1 serves as an output terminal; agate electrode of the NMOS MN2 serves as another input terminal for receiving another one of the compensated subtraction signal $V_R''$ or the reference voltage, and a drain electrode of the NMOS MN2 serves as another output terminal; a source electrode of the NMOS MN3 is coupled to a ground voltage, a drain electrode of the NMOS MN3 is coupled to source electrodes of the NMOSs MN1 and MN2, and a gate electrode of the NMOS MN3 is controlled by a clock signal CLK; a drain electrode of the PMOS MP1 is coupled to the drain electrode of the NMOS MN1, and a source electrode of the PMOS MP1 is coupled to a supply voltage VDD; and a drain electrode of the PMOS MP2 is coupled to the drain electrode of the NMOS MN2, a source electrode of the PMOS MP2 is coupled to the supply voltage VDD, and gate electrodes of the PMOSs MP1 and MP2 are controlled by a bias voltage Vb. In addition, a capacitor C3 is positioned between the gate electrode (input terminal) of the NMOS MN1 and the drain electrode (output terminal) of the NMOS MN2 to provide a capacitance in the positive feedback path, and a capacitor C4 is positioned between the gate electrode (input terminal) of the NMOS MN2 and the drain electrode (output terminal) of the NMOS MN1 to provide a capacitance in the positive feedback path. By using the capacitors C3 and C4 serving as the negative capacitors, the input capacitance of the comparators (i.e. the parasitic capacitance between the gate electrodes of the NMOS MN1/MN2 and ground) within the quantizer 150 can be reduced, and the stability problem in the "$s^{-1}$" path and the ELD path can be improved.

For example, if the negative capacitor circuit 140 is not used in the delta-sigma modulator 100, a pole frequency (3-dB frequency) may be 800-900 MHz; and if the negative capacitor circuit 140 is used in the delta-sigma modulator 100, a pole frequency (3-dB frequency) may be greater than 2.5 GHz, which can effectively improve the stability and performance.

Figure 5:
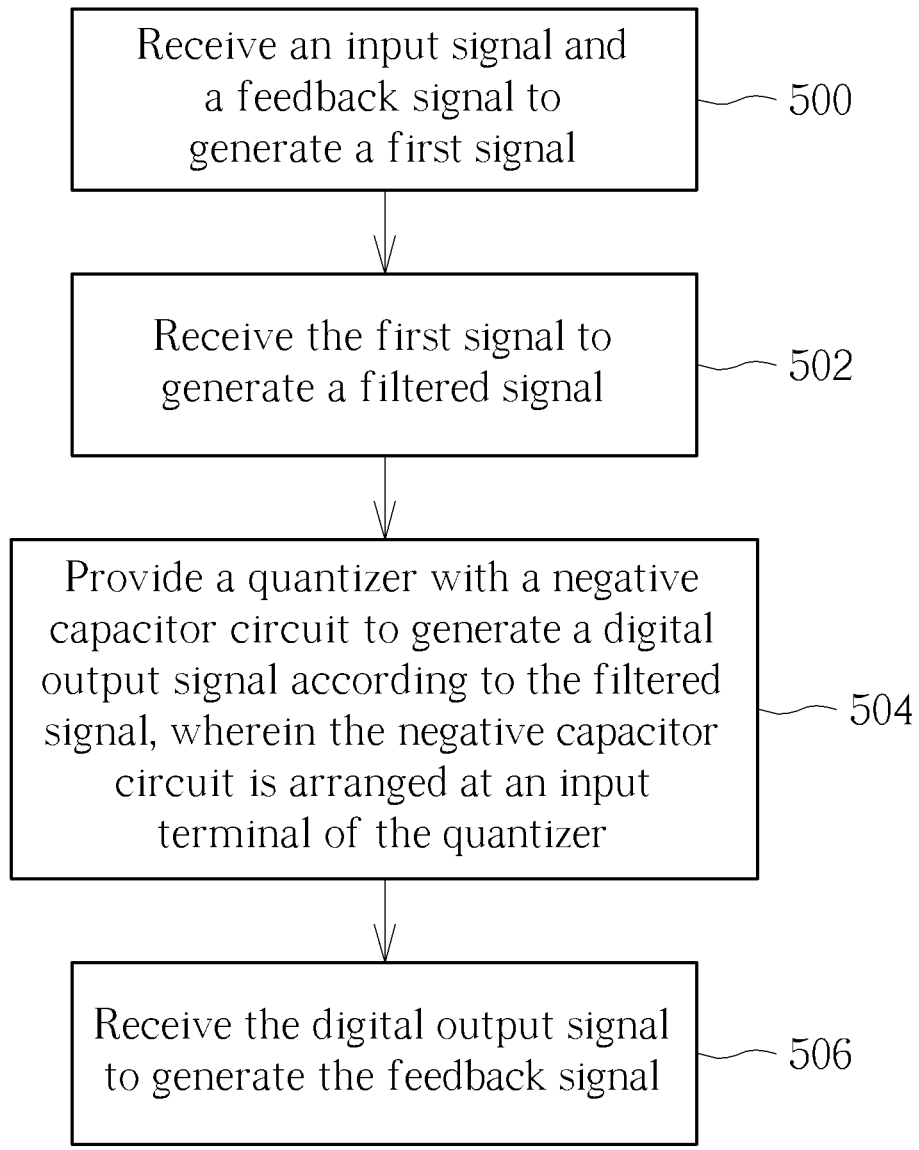
FIG. 5 is a flowchart of a method for enhancing stability of a delta-sigma modulator.

FIG. 5 is a flowchart of a method for enhancing stability of a delta-sigma modulator. Referring to the disclosure mentioned above, the flow is as follows.

Step 500: receive an input signal and a feedback signal to generate a first signal.

Step 502: receive the first signal to generate a filtered signal.

Step 504: provide a quantizer with a negative capacitor circuit to generate a digital output signal according to the filtered signal, wherein the negative capacitor circuit is arranged at an input terminal of the quantizer.

Step 506: receive the digital output signal to generate the feedback signal.

Briefly summarized, in the delta-sigma modulator of the present invention, a negative capacitor circuit is provided at the input terminal of the quantizer to reduce the input parasitic capacitance of the quantizer. By using the negative capacitor circuit of the present invention, the extra pole effect can be largely reduced, and the stability issue in the ELD path and the "$s_{-1}$" path can be improved.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A delta-sigma modulator, comprising:
a receiving circuit, for receiving an input signal and a feedback signal to generate a first signal;
a loop filter, coupled to the receiving circuit, for receiving the first signal to generate a filtered signal;
a quantizer with a negative capacitor circuit, coupled to the loop filter, for generating a digital output signal according to the filtered signal, wherein the negative capacitor circuit is arranged at an input terminal of the quantizer; and
a first feedback circuit, for receiving the digital output signal to generate the feedback signal.

2. The delta-sigma modulator of claim 1, further comprising:
a second feedback circuit, for receiving the digital output signal to generate an excess loop delay (ELD) compensation signal;
a subtractor, coupled to the loop filter, the quantizer and the second feedback circuit, for calculating a difference between the filtered signal and the ELD compensation signal to generate a compensated subtraction signal to the quantizer;
wherein the quantizer generates the digital output signal according to the compensated subtraction signal.

3. The delta-sigma modulator of claim 1, wherein the negative capacitor circuit is arranged to reduce input capacitance of the quantizer to reduce extra pole/delay.

4. The delta-sigma modulator of claim 1, wherein the quantizer comprises a plurality of comparators, and the negative capacitor circuit is positioned at positive feedback paths of the comparators.

5. The delta-sigma modulator of claim 4, wherein the negative capacitor circuit comprises a plurality of capacitors, and each positive feedback path of the comparators has a capacitor.

6. The delta-sigma modulator of claim 4, wherein each of the comparator comprises:
an input pair comprising a first transistor and a second transistor, wherein the negative capacitor circuit provides a capacitance between an input terminal of the first transistor and an output terminal of the second transistor, and the negative capacitor circuit further provides a capacitance between an input terminal of the second transistor and an output terminal of the first transistor.

7. The delta-sigma modulator of claim 6, wherein the comparator comprises:
a first PMOS serving as the first transistor, wherein a gate electrode of the first PMOS serves as the input terminal, and a drain electrode of the first PMOS serves as the output terminal;
a second PMOS serving as the first transistor, wherein a gate electrode of the second PMOS serves as the input terminal, and a drain electrode of the second PMOS serves as the output terminal;
a third PMOS, wherein a source electrode of the third PMOS is coupled to a supply voltage, a drain electrode of the third PMOS is coupled to source electrodes of the first PMOS and the second PMOS;
a first NMOS, wherein a drain electrode of the first NMOS is coupled to the drain electrode of the first PMOS, and a source electrode of the first NMOS is coupled to a ground voltage; and
a second NMOS, wherein a drain electrode of the second NMOS is coupled to the drain electrode of the second PMOS, a source electrode of the second NMOS is coupled to the ground voltage, and a gate electrode of the second NMOS is coupled to a gate electrode of the first NMOS.

8. The delta-sigma modulator of claim 6, wherein the comparator comprises:
a first NMOS serving as the first transistor, wherein a gate electrode of the first NMOS serves as the input terminal, and a drain electrode of the first NMOS serves as the output terminal;
a second NMOS serving as the first transistor, wherein a gate electrode of the second NMOS serves as the input terminal, and a drain electrode of the second NMOS serves as the output terminal;
a third NMOS, wherein a source electrode of the third NMOS is coupled to a ground voltage, a drain electrode of the third NMOS is coupled to source electrodes of the first NMOS and the second NMOS;

a first PMOS, wherein a drain electrode of the first PMOS is coupled to the drain electrode of the first NMOS, and a source electrode of the first PMOS is coupled to a supply voltage; and a second PMOS, wherein a drain electrode of the second PMOS is coupled to the drain electrode of the second NMOS, a source electrode of the second PMOS is coupled to the supply voltage, and a gate electrode of the second NMOS is coupled to a gate electrode of the first NMOS.

9. The delta-sigma modulator of claim 1, wherein the delta-sigma modulator is a continuous time delta-sigma modulator.

10. A method for enhancing stability of a delta-sigma modulator, comprising:
   receiving an input signal and a feedback signal to generate a first signal;
   receiving the first signal to generate a filtered signal;
   providing a quantizer with a negative capacitor circuit, to generate a digital output signal according to the filtered signal, wherein the negative capacitor circuit is arranged at an input terminal of the quantizer; and
   receiving the digital output signal to generate the feedback signal.

11. The method of claim 10, further comprising:
   receiving the digital output signal to generate an excess loop delay (ELD) compensation signal;
   calculating a difference between the filtered signal and the ELD compensation signal to generate a compensated subtraction signal to the quantizer;
   wherein the quantizer generates the digital output signal according to the compensated subtraction signal.

12. The method of claim 10, wherein the negative capacitor circuit is arranged to reduce input capacitance of the quantizer to reduce extra pole/delay.

13. The method of claim 10, wherein the quantizer comprises a plurality of comparators, and the negative capacitor circuit is positioned at positive feedback paths of the comparators.

14. The method of claim 13, wherein the negative capacitor circuit comprises a plurality of capacitors, and each positive feedback path of the comparators has a capacitor.

15. The method of claim 13, wherein each of the comparator comprises:
   an input pair comprising a first transistor and a second transistor, wherein the negative capacitor circuit provides a capacitance between an input terminal of the first transistor and an output terminal of the second transistor, and the negative capacitor circuit further provides a capacitance between an input terminal of the second transistor and an output terminal of the first transistor.

16. The method of claim 15, wherein the comparator comprises:
   a first PMOS serving as the first transistor, wherein a gate electrode of the first PMOS serves as the input terminal, and a drain electrode of the first PMOS serves as the output terminal;
   a second PMOS serving as the first transistor, wherein a gate electrode of the second PMOS serves as the input terminal, and a drain electrode of the second PMOS serves as the output terminal;
   a third PMOS, wherein a source electrode of the third PMOS is coupled to a supply voltage, a drain electrode of the third PMOS is coupled to source electrodes of the first PMOS and the second PMOS;
   a first NMOS, wherein a drain electrode of the first NMOS is coupled to the drain electrode of the first PMOS, and a source electrode of the first NMOS is coupled to a reference voltage; and
   a second NMOS, wherein a drain electrode of the second NMOS is coupled to the drain electrode of the second PMOS, a source electrode of the second NMOS is coupled to the reference voltage, and a gate electrode of the second NMOS is coupled to a gate electrode of the first NMOS.

17. The method of claim 15, wherein the comparator comprises:
   a first NMOS serving as the first transistor, wherein a gate electrode of the first NMOS serves as the input terminal, and a drain electrode of the first NMOS serves as the output terminal;
   a second NMOS serving as the first transistor, wherein a gate electrode of the second NMOS serves as the input terminal, and a drain electrode of the second NMOS serves as the output terminal;
   a third NMOS, wherein a source electrode of the third NMOS is coupled to a reference voltage, a drain electrode of the third NMOS is coupled to source electrodes of the first NMOS and the second NMOS;
   a first PMOS, wherein a drain electrode of the first PMOS is coupled to the drain electrode of the first NMOS, and a source electrode of the first PMOS is coupled to a supply voltage; and
   a second PMOS, wherein a drain electrode of the second PMOS is coupled to the drain electrode of the second NMOS, a source electrode of the second PMOS is coupled to the supply voltage, and a gate electrode of the second NMOS is coupled to a gate electrode of the first NMOS.

18. The method of claim 10, wherein the delta-sigma modulator is a continuous time delta-sigma modulator.

* * * * *